United States Patent
Chang et al.

(10) Patent No.: US 7,778,088 B2
(45) Date of Patent: Aug. 17, 2010

(54) ERASING FLASH MEMORY USING ADAPTIVE DRAIN AND/OR GATE BIAS

(75) Inventors: Kuo-Tung Chang, Saratoga, CA (US); Wei Zheng, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 261 days.

(21) Appl. No.: 11/612,863

(22) Filed: Dec. 19, 2006

(65) Prior Publication Data

US 2008/0144396 A1  Jun. 19, 2008

(51) Int. Cl.
 *G11C 16/04* (2006.01)
(52) U.S. Cl. ............... 365/185.29; 365/185.33; 365/185.18; 710/102; 710/103
(58) Field of Classification Search ............ 365/185.29, 365/185.33, 185.18; 710/102, 103
See application file for complete search history.

(56) References Cited

U.S. PATENT DOCUMENTS

| | | | | |
|---|---|---|---|---|
| 5,537,358 A | * | 7/1996 | Fong | 365/218 |
| 5,930,174 A | * | 7/1999 | Chen et al. | 365/185.29 |
| 6,052,310 A | * | 4/2000 | Sunkavalli | 365/185.29 |
| 6,097,632 A | * | 8/2000 | Roohparvar | 365/185.19 |
| 6,269,025 B1 | * | 7/2001 | Hollmer et al. | 365/185.29 |
| 6,515,909 B1 | * | 2/2003 | Wooldridge | 365/185.22 |
| 2002/0067641 A1 | | 6/2002 | Ogura et al. | |

FOREIGN PATENT DOCUMENTS

| | | |
|---|---|---|
| EP | 1227501 A | 7/2002 |
| EP | 133445 A | 8/2003 |
| WO | WO 02/071410 A | 9/2002 |

OTHER PUBLICATIONS

Search Report for PCT/US07/88206, May 27, 2008, Spansion LLP.
Written Opinion for PCT/US07/88206, May 27, 2008, Spansion LLP.

* cited by examiner

*Primary Examiner*—VanThu Nguyen
*Assistant Examiner*—Eric Wendler (57) ABSTRACT

A hot hole erase operation as described herein can be utilized for a flash memory device having an array of memory cells. The erase operation employs an adaptive erase bias voltage scheme where the drain bias voltage (and/or the gate bias voltage) is dynamically adjusted in response to an erase pulse count corresponding to a preliminary erase operation during which a relatively small portion of a sector is erased. The adjustment of the erase bias voltage in this manner enables the rest of the sector to be erased using erase bias voltages that are better suited to the current erase characteristics of the sector.

17 Claims, 5 Drawing Sheets

ERASING FLASH MEMORY USING ADAPTIVE DRAIN AND/OR GATE BIAS

TECHNICAL FIELD

Embodiments of the present invention relate generally to flash memory devices. More particularly, embodiments of the present invention relate to erase operations for flash memory devices.

BACKGROUND

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory element, such as a flash memory unit. In this regard, one conventional flash memory technology is based upon a memory cell that utilizes a charge trapping dielectric element that is capable of storing two bits of data. In such an arrangement, one bit can be stored using a first charge storing region on one side of the charge trapping dielectric element, while a second bit can be stored using a second charge storing region on the other side of the charge trapping dielectric element.

Figure 1:
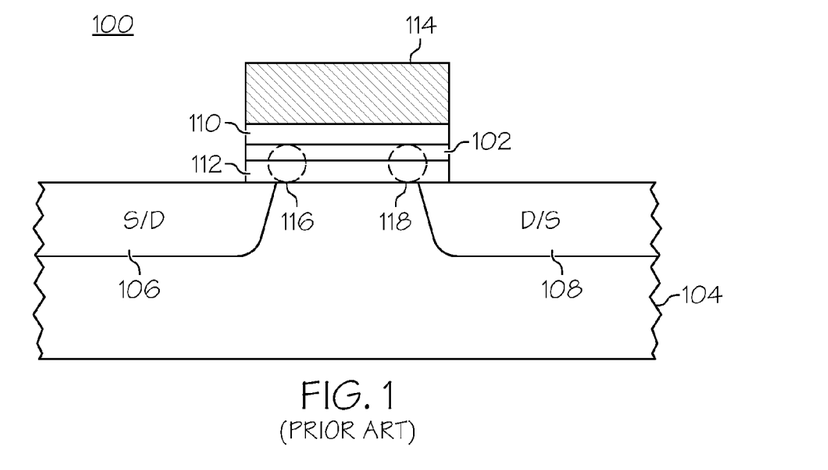
FIG. 1 is a cross sectional view of a conventional dual bit memory cell.

FIG. 1 is a cross sectional view of a conventional dual bit memory cell 100. Memory cell 100 includes a silicon nitride layer 102 and a P-type semiconductor substrate 104 having a first buried junction region 106 and a second buried junction region 108. First buried junction region 106 and second buried junction region 108 are each formed from an N+ semiconductor material. Silicon nitride layer 102 is sandwiched between two layers of silicon oxide (identified by reference numbers 110 and 112).

Overlying silicon oxide layer 110 is a polysilicon gate 114. Gate 114 is doped with an N-type impurity (e.g., phosphorus). Memory cell 100 is capable of storing two data bits: a left bit represented by the dashed circle 116; and a right bit represented by the dashed circle 118. In practice, memory cell 100 is generally symmetrical and first buried junction region 106 and second buried junction region 108 are interchangeable. In this regard, first buried junction region 106 may serve as the source region with respect to the right bit 118, while second buried junction region 108 may serve as the drain region with respect to the right bit 118. Conversely, second buried junction region 108 may serve as the source region with respect to the left bit 116, while first buried junction region 106 may serve as the drain region with respect to the left bit 116.

Figure 2:
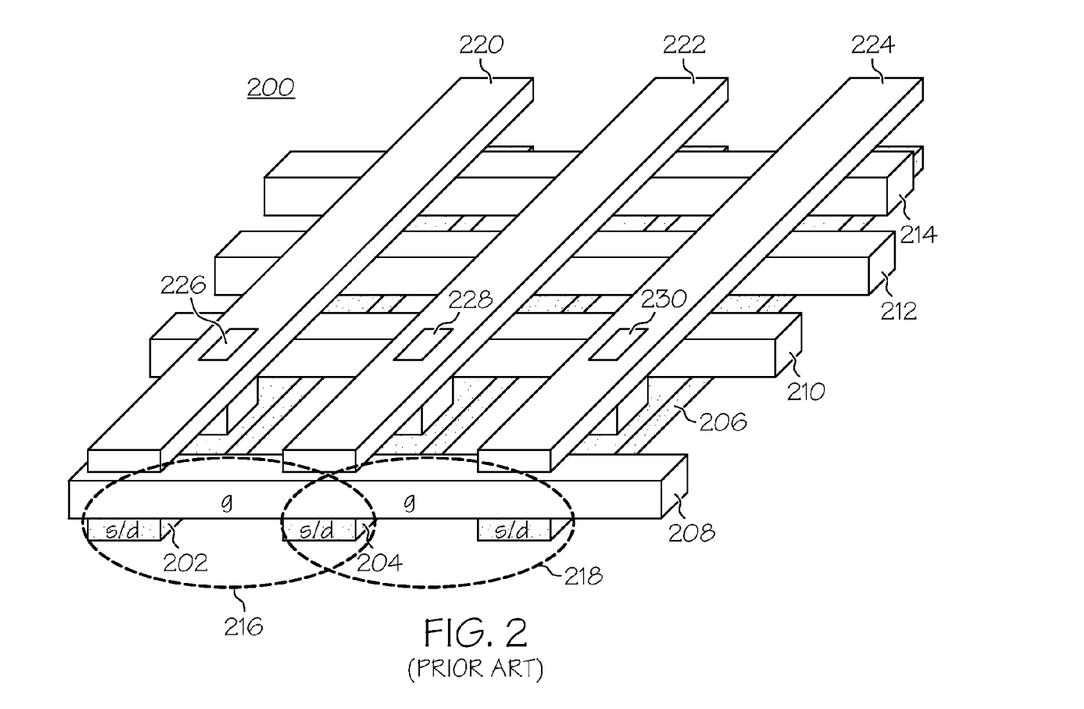
FIG. 2 is a simplified diagram of a plurality of dual bit memory cells arranged in accordance with a conventional virtual ground array architecture.

FIG. 2 is a simplified diagram of a plurality of dual bit memory cells arranged in accordance with a conventional virtual ground array architecture 200 (a practical array architecture can include up to millions of dual bit memory cells). Array architecture 200 includes a number of buried bitlines formed in a semiconductor substrate as mentioned above. FIG. 2 depicts three buried bit lines (reference numbers 202, 204, and 206), each being capable of functioning as a drain or a source for memory cells in array architecture 200. Array architecture 200 also includes a number of wordlines that are utilized to control the gate voltage of the memory cells. FIG. 2 depicts four wordlines (reference numbers 208, 210, 212, and 214) that generally form an orthogonal pattern with the bitlines. Although not shown in FIG. 2, charge trapping dielectric material is under the wordlines and between the bitlines. The dashed lines in FIG. 2 represent two of the dual bit memory cells in array architecture 200: a first cell 216 and a second cell 218. Notably, bitline 204 is shared by first cell 216 and second cell 218. Array architecture 200 is known as a virtual ground architecture because ground potential can be applied to any selected bitline and there need not be any bitlines with a fixed ground potential.

Control logic and circuitry for array architecture 200 governs the selection of memory cells, the application of voltage to the wordlines, and the application of voltage to the bitlines during conventional flash memory operations, such as: programming; reading; erasing; soft programming; and verification. Voltage is delivered to the bitlines using conductive metal lines and bitline contacts. FIG. 2 depicts three conductive metal lines (reference numbers 220, 222, and 224) and three bitline contacts (reference numbers 226, 228, and 230). For a given bitline, a bitline contact is used once every certain number of wordlines (typically every 16 wordlines, but sometimes every 8 or every 32 wordlines).

Programming of memory cell 100 can be accomplished by known hot electron injection techniques (also known as channel hot electron or CHE programming). In accordance with conventional programming techniques, the right bit 118 is programmed by applying a relatively high programming voltage to gate 114 via the appropriately selected wordline, grounding the bitline corresponding to first buried junction region 106 (which serves as the source in this case), and applying a relatively high drain bias voltage to the bitline corresponding to second buried junction region 108 (which serves as the drain in this case). Conversely, the left bit 116 is programmed by applying a relatively high programming voltage to gate 114 via the appropriately selected wordline, grounding the bitline corresponding to second buried junction region 108 (which serves as the source in this case), and applying a relatively high drain bias voltage to the bitline corresponding to first buried junction region 106 (which serves as the drain in this case).

Erasing of memory cell 100 can be accomplished using hot hole erase techniques. Hot hole erasing of the left bit 116 is performed by applying a relatively high negative erase voltage (e.g., −6.0 volts) to gate 114 via the appropriately selected wordline, applying a relatively high drain bias voltage (e.g., 5.0 volts) to the bitline corresponding to first buried junction region 106 (which serves as the drain in this scenario), and floating the bitline corresponding to second buried junction region 108 (which serves as the source in this scenario). Hot hole erasing of the right bit 118 is performed by applying a relatively high negative erase voltage (e.g., −6.0 volts) to gate 114 via the appropriately selected wordline, applying a relatively high drain bias voltage (e.g., 5.0 volts) to the bitline corresponding to second buried junction region 108 (which serves as the drain in this scenario), and floating the bitline corresponding to first buried junction region 106 (which serves as the source in this scenario). Such erasing is intended to leave both bits of memory cell 100 in an erased or unprogrammed state. Flash memory arrays typically include sectors of many individual memory cells, and the cells are typically erased on a sector-by-sector basis. In other words, all of the bits in a given sector are erased before the erase operation proceeds to the next sector.

Conventional hot hole erasing of flash memory cells utilizes defined and fixed erase bias voltages (i.e., the negative gate voltage and the drain bias voltage are fixed during the erase procedure and throughout the entire life of the flash memory device). These fixed voltages are selected to compensate for the effects of program-erase cycling, which alters the electrical characteristics of the memory cells over time. In this regard, memory cells that have been highly cycled typically require higher negative gate voltage and/or higher drain voltage during erase operations, relative to memory cells that have been subjected to less cycling. Thus, the fixed erase bias voltages are selected to accommodate the "worst case scenario" of highly cycled cells. Although relatively high drain voltage and/or relatively high negative gate voltage may be desirable to erase highly-cycled memory cells, such bias voltages may not be necessary to erase memory cells that have not been highly cycled. Indeed, the application of very high negative gate voltage and/or very high drain voltage during an erase operation on newer devices can induce degradation in the memory cells. On the other hand, if relatively lower negative gate bias and/or relatively low drain voltage is used to minimize degradation, the erase time for highly cycled devices will be too long.

BRIEF SUMMARY

A flash memory erase technique as described herein can be utilized in connection with sector-by-sector erase operations. The erase technique employs an adaptive erase bias voltage scheme to provide erase bias voltages that are better suited to the current erase characteristics of the device. In one embodiment, erase pulses are counted during a preliminary erase operation on a portion of a memory array sector, the erase bias voltages are dynamically adjusted in response to the erase pulse count, and the adjusted erase bias voltages are utilized in connection with a secondary erase operation on the remainder of the sector.

The above and other aspects of the invention may be carried out in one embodiment by an erase method for a nonvolatile memory device having an array of memory cells, each memory cell being configured to store information corresponding to at least one bit. The method involves: initiating an erase operation for a group of bits in the array of memory cells; obtaining a count corresponding to a number of erase pulses utilized to erase a first portion of the group of bits; determining an adjusted erase bias voltage in response to the count; and erasing a second portion of the group of bits utilizing the adjusted erase bias voltage.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the invention or the application and uses of such embodiments. Furthermore, there is no intention to be bound by any expressed or implied theory presented in the preceding technical field, background, brief summary or the following detailed description.

Embodiments of the invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present invention may be practiced in conjunction with any number of data transmission protocols and that the system described herein is merely one example embodiment of the invention.

For the sake of brevity, conventional techniques related to transistor design and manufacturing, the control of flash memory devices, memory cell programming, memory cell erasing, memory cell verification operations, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the schematics shown herein depict suitable arrangements of elements, additional intervening elements, devices, features, or components may be present in an embodiments of the invention.

Figure 3:
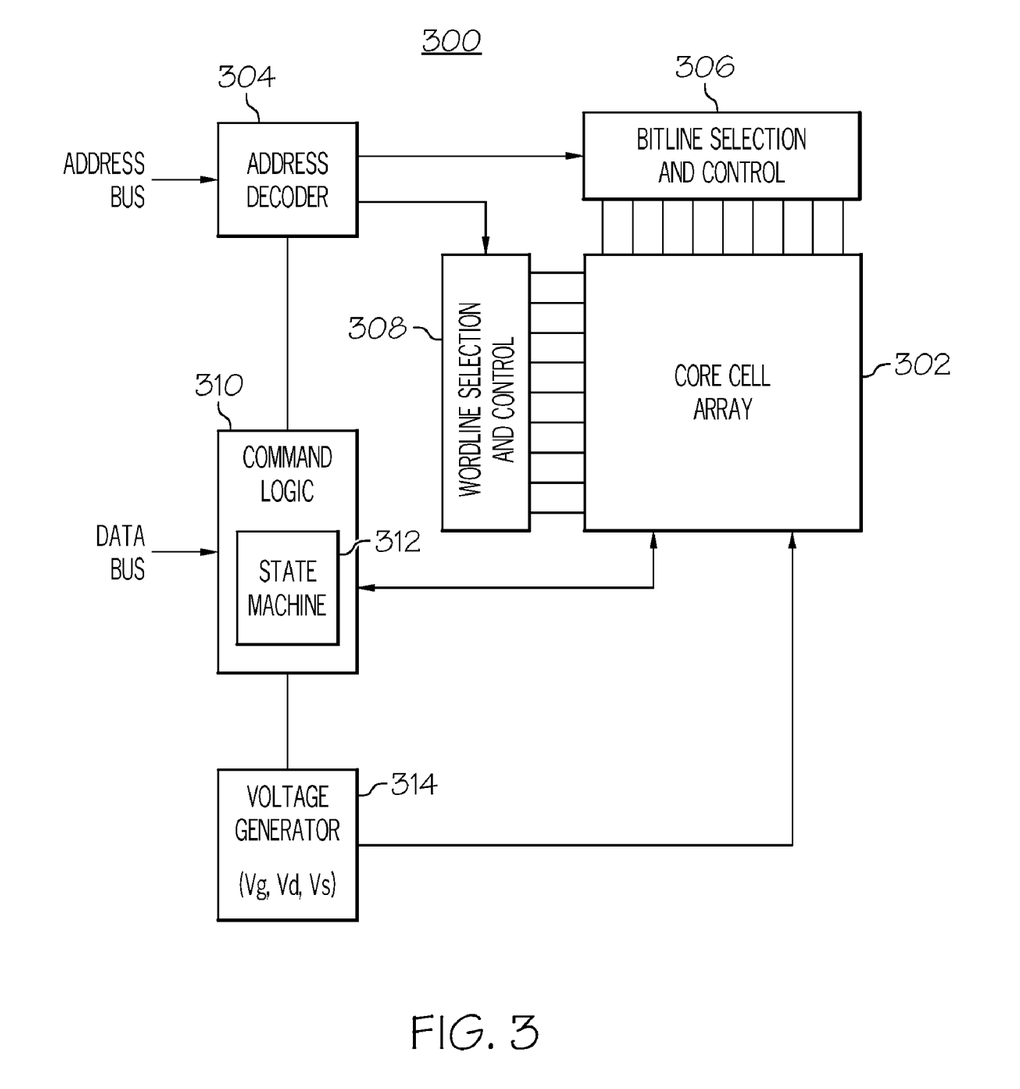
FIG. 3 is a schematic representation of a flash memory system configured in accordance with an example embodiment of the invention.

FIG. 3 is a schematic representation of a flash memory system 300 configured in accordance with an example embodiment of the invention. System 300 is an overly simplified representation of an example embodiment, and an actual deployment of system 300 may include conventional elements, logic, components, and functionality not shown in FIG. 3. Briefly, system 300 is provided for performing programming, verifying, soft programming and erasing of a core cell array 302, which may utilize a virtual ground architecture or any suitable flash memory architecture.

A memory cell is a transistor-based element that may be configured to store one or more bits of information, depending upon the operating characteristics and configuration of the memory cell. In a practical flash memory system, each bit of information ultimately represents either a logic high or a logic low value. As used herein, a "bit" may also refer to a single-bit memory cell itself and/or any portion of a multiple-bit memory cell that is configured to retain a charge corresponding to a single bit of information. In this regard, the memory cells within core cell array 302 may be dual bit memory cells (see FIG. 1), single bit memory cells, or any suitably configured flash memory cells. Indeed, the hot hole erase techniques and technologies described herein can be utilized in connection with a memory cell having any number of bits. In practical embodiments, core cell array 302 is partitioned into a plurality of sectors, where memory cells within a sector are grouped together via all the wordlines that share the same sector address. It is to be appreciated that core cell array 302 could be realized in any number of different configurations having any designated number of cells, bits, wordlines, and bitlines. In addition, core cell array 302 may utilize any number of sectors (within practical limitations).

Flash memory system 300 includes an address decoder 304 coupled to core cell array 302 for decoding input and/or output ("I/O") signals during various operations that are performed on core cell array 302 (e.g., programming, reading, verifying, soft programming, erasing). In this example, address decoder 304 receives address bus information from a system controller (not shown) or the like. Address decoder 304 may be coupled to bitline selection and control logic 306, which is suitably configured to select one or more desired bitlines as needed to support the various flash memory operations described herein. Likewise, address decoder 304 may be coupled to wordline selection and control logic 308, which is suitably configured to select one or more desired wordlines as needed to support the various flash memory operations described herein. System 300 may leverage known addressing and switching techniques to select a desired target cell (or a plurality of target cells) in core cell array 302 for programming, soft programming, reading, erasing, program verification, erase verification, soft program verification, etc.

Flash memory system 300 may also utilize a command logic component 310, which may include or communicate with a state machine 312. In example embodiments of system 300, command logic component 310 and/or state machine 312 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, a processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

In this example, command logic component 310 is coupled to core cell array 302 using suitable interconnection elements, structure, or architecture. Command logic component 310 and state machine 312 may receive commands or instructions from a data bus connected to a system controller or the like. The commands or instructions invoke algorithms embedded in command logic component 310 and state machine 312. The algorithms perform the various tasks and processes related to programming, reading, erasing, soft programming, verifying, and other operations to be described herein. Moreover, the steps of a method or algorithm described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

Flash memory system 300 may also include a voltage generator component 314, which is coupled to core cell array 302, to command logic component 310, and to state machine 312. Voltage generator component 314 is controlled by command logic component 310 and/or state machine 312. Voltage generator component 314 is suitably configured to generate the necessary voltages utilized in connection with programming, reading, erasing, soft programming, and verifying of the memory cells in core cell array 302. For example, voltage generator component 314 may include or utilize one or more charge pumps, one or more voltage divider circuits, and/or one or more distinct voltage sources. Voltage generator component 314 may be designed to provide any number of fixed, variable, and/or dynamically adjustable voltage signals. As described in more detail below, voltage generator component 314 is configured to generate and apply the following to core cell array 302, without limitation: program and erase gate bias voltages ($V_G$) applied to the wordlines of target cells; drain voltages ($V_D$) applied to selectable bitlines of target cells; source voltages ($V_S$) applied to selectable bitlines of target cells; verification voltages applied to the wordlines of target cells; verification voltages applied to the wordline of a reference cell; and bias voltages applied to the reference cell.

Flash memory system 300 may be suitably configured to support an adaptive bias erase operation as described in more detail below. Briefly, such an adaptive bias erase operation utilizes a dynamically adjustable drain bias voltage and/or a dynamically adjustable gate bias voltage to erase bits in an array of memory cells. In the embodiments described herein, a preliminary erase operation is performed on a relatively small number of bits and the number of erase pulses utilized during the preliminary erase operation is counted. Default erase bias voltages may be applied to the array during this preliminary erase operation. The erase pulse count is then used to determine how best to adjust a baseline drain bias voltage and/or a baseline gate bias voltage such that the adjusted voltage (or voltages) can be utilized for a secondary erase operation that follows the preliminary erase operation.

Figure 4:
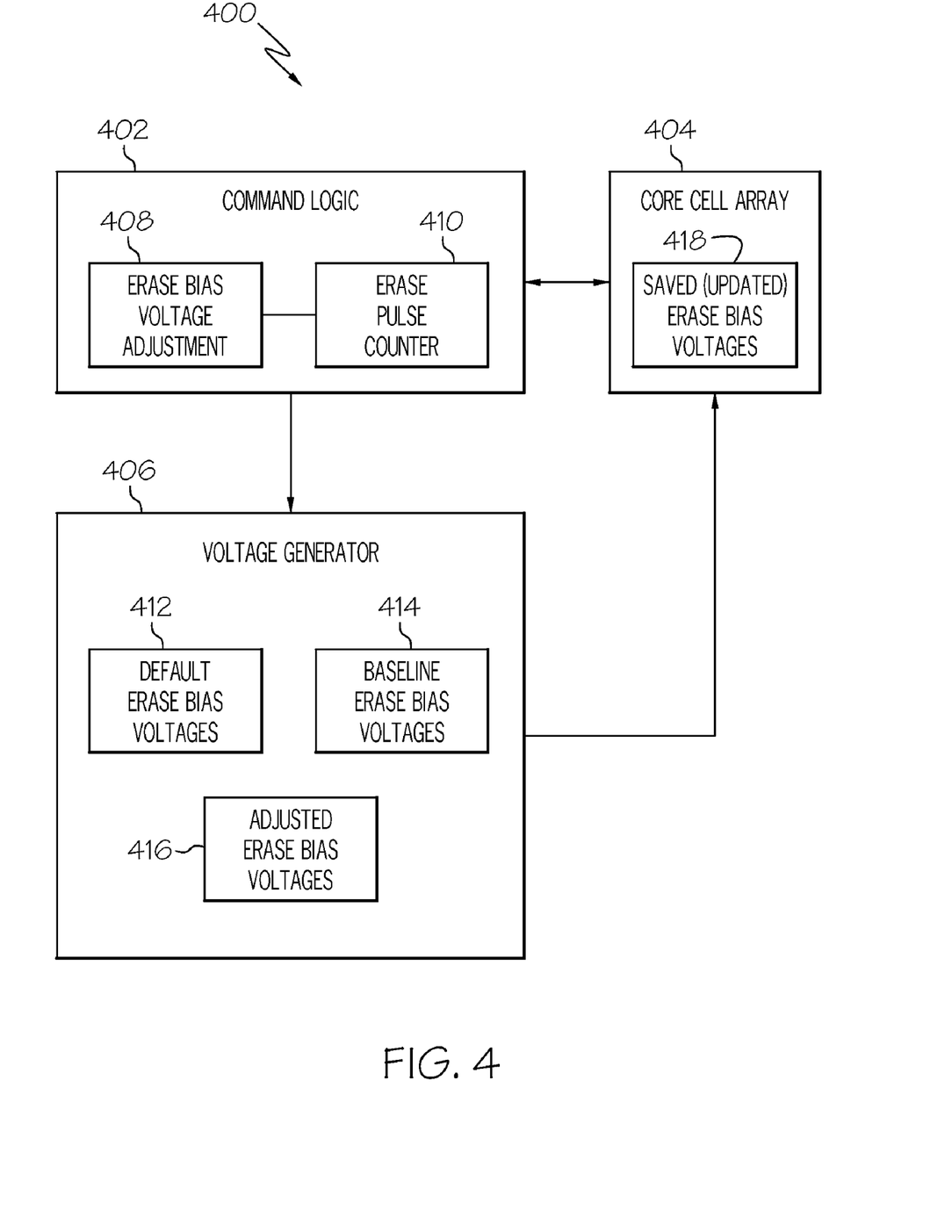
FIG. 4 is a schematic representation of a portion of a flash memory system configured to perform an adaptive bias erase operation.

FIG. 4 is a schematic representation of a portion of a flash memory system 400 configured to perform an adaptive bias erase operation as described in more detail herein. The logical and functional elements depicted in FIG. 4 may be implemented in any suitable system, including, for example, flash memory system 300. For consistency with FIG. 3, flash memory system 400 is depicted with a command logic component 402, a core cell array 404 (also referred to herein as a memory array), and a voltage generator 406. The general characteristics and functionality of these components were described above for flash memory system 300 and, as such, will not be redundantly described here in the context of flash memory system 400.

In this example, command logic component 402 is suitably configured to initiate and control an erase operation for a group of bits (e.g., a sector) in core cell array 404. This erase operation may include a preliminary erase operation followed by a secondary erase operation. To support this erase operation, command logic component 402 may include an erase bias voltage adjustment component 408 and an erase pulse counter 410. Command logic component 402 may also be configured to control the operation of voltage generator 406. To support adaptive bias erase operations, voltage generator 406 may be suitably configured to establish, maintain, utilize, generate, or otherwise process: one or more default erase bias voltages 412; one or more baseline erase bias voltages 414; and/or one or more adjusted erase bias voltages 416. As an optional feature, core cell array 404 may be utilized to store one or more saved or updated erase bias voltages 418, which may be used during subsequent preliminary erase operations.

Erase pulse counter 410 is suitably configured to maintain a count corresponding to the number of erase pulses that are applied to erase the bits during the preliminary erase operation. Erase bias voltage adjustment component 408 processes the count after completion of the preliminary erase operation. In this example, erase bias voltage adjustment component 408 determines at least one adjusted erase bias voltage 416 (which may be a drain bias voltage, a gate bias voltage, or both) in response to the erase pulse count. As described below, the bias voltages can be adjusted in a stepwise manner according to the count. Eventually, voltage generator 406 can apply adjusted erase bias voltages 416 (or voltages derived from adjusted erase bias voltages 416) to core cell array 404 (or any portion thereof) to erase bits that still need to be erased. The operation of flash memory system 400 will be explained in more detail in connection with FIG. 5 and FIG. 6.

Figure 5:
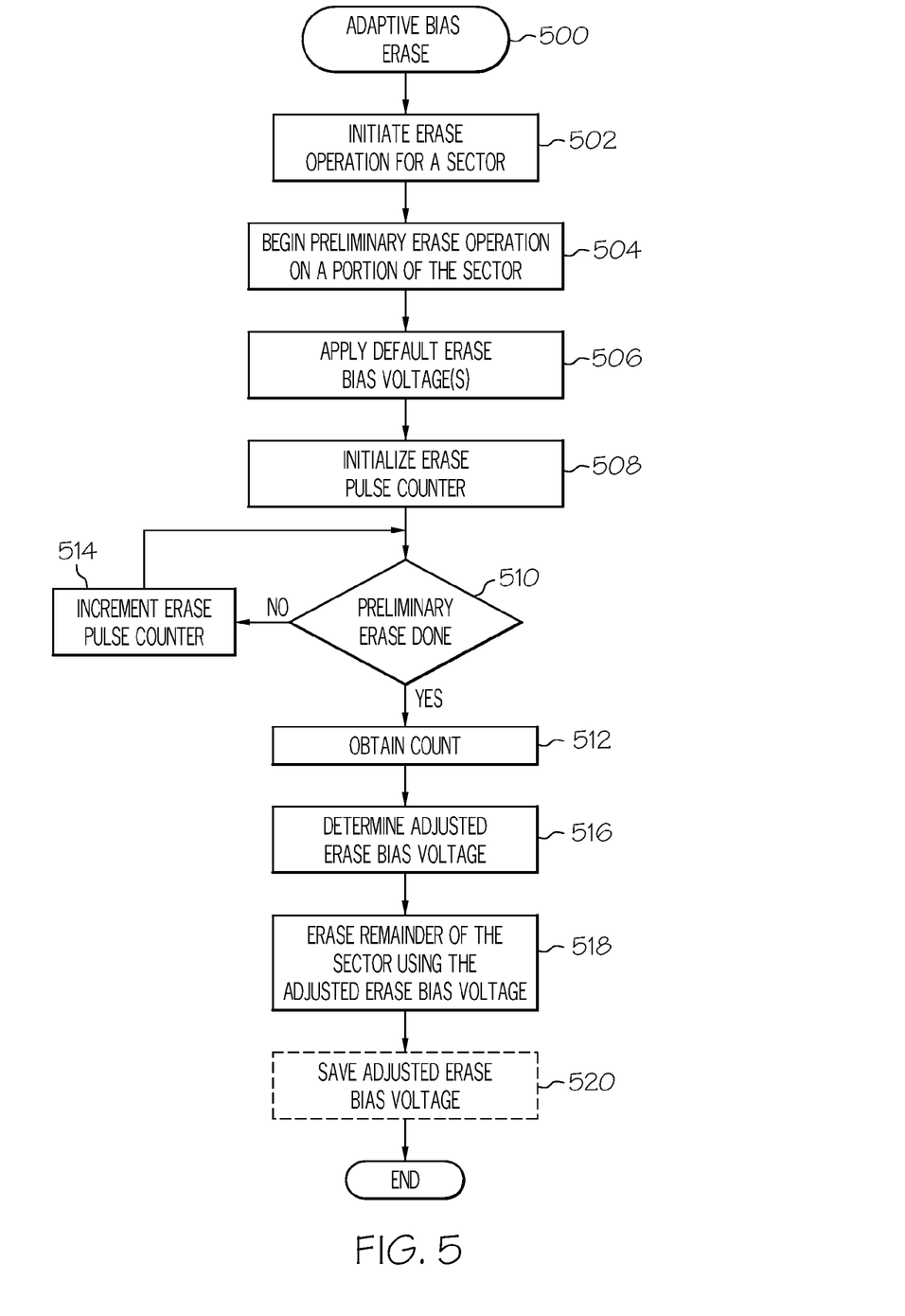
FIG. 5 is a flow chart that illustrates an adaptive bias erase operation.

FIG. 5 is a flow chart that illustrates an adaptive bias erase operation 500 that can be performed by a flash memory device or system. The various tasks performed in connection with process 500 may be performed by software, hardware, firmware, or any combination thereof. For illustrative purposes, the following description of process 500 may refer to elements mentioned above in connection with FIGS. 1-4. In embodiments of the invention, portions of process 500 may be performed by different elements of the described system, e.g., a command component, a voltage generator, or a memory array. It should be appreciated that process 500 may include any number of additional or alternative tasks, the tasks shown in FIG. 5 need not be performed in the illustrated order, and process 500 may be incorporated into a more comprehensive procedure or process having additional functionality not described in detail herein.

Adaptive bias erase process 500 may be performed for any flash memory device that employs hot hole erase techniques to erase bits in the memory cells. Process 500 may begin by initiating an erase operation for a group of bits in an array of memory cells (task 502). In this example, the group of bits corresponds to a sector in the memory array, and the erase operation is intended to erase all of the bits in the sector. Process 500 may begin a preliminary erase operation on a first portion of the sector (task 504). In one embodiment, the preliminary erase operation is performed at the beginning of the sector erase procedure, and the first portion represents a relatively small percentage of the sector. For example, the first portion of the sector should be less than half of the entire sector and, preferably, the first portion of the sector represents approximately ten percent of the entire sector. Of course, the exact percentage may be more or less than ten percent, depending upon the intended application, operating conditions, and/or other practical considerations.

In an alternate embodiment, the preliminary erase operation may be performed on a reference portion of the sector or on a reference portion of the memory array. In other words, the preliminary erase operation need not be performed in connection with the actual bits that are desired to be erased.

When performing the preliminary erase operation, the flash memory system applies at least one default erase bias voltage to the first portion of the sector (task 506). Task 506 may apply a default drain bias voltage and/or a default gate bias voltage during the preliminary erase operation. The default drain bias voltage may be a fixed voltage that does not change over the life of the flash memory device, or it may be updated during the life of the flash memory device. Likewise, the default gate bias voltage may be a fixed voltage that does not change over the life of the flash memory device, or it may be updated during the life of the flash memory device. A typical fixed default drain bias voltage may be in the range of about 4.0 volts to about 6.0 volts, while a typical fixed default gate bias voltage may be in the range of about negative 5.0 volts to about negative 10.0 volts.

At the beginning of the preliminary erase operation, adaptive bias erase process 500 initializes the erase pulse counter (task 508) before it proceeds to actually erase the designated bits in the first portion of the sector using the default erase bias voltage(s). The erase pulse counter keeps track of the number of erase pulses that are applied to the first portion of the sector during the preliminary erase operation. The erase pulse count represents the total number of pulse counts required to complete erase for the first portion of the sector. In practice, the erase pulses are applied to multiple bits. One pulse is one count regardless of how many bits receive that pulse. During the preliminary erase operation, the erase pulses may only cover a sub-portion of the first portion of the sector, and then move on to another sub-portion. The count for each sub-portion may not be the same, and the maximum of the erase counts is considered rather than the accumulation of all erase pulses.

If a query task 510 determines that the preliminary erase operation is complete (i.e., all of the bits in the first portion of the sector have been verified as being erased), then adaptive bias erase process 500 may proceed to a task 512, which obtains the count corresponding to the total number of erase pulses utilized to erase the first portion of the sector. If the preliminary erase operation is incomplete, then the erase pulse counter may be incremented (task 514) by an appropriate amount to reflect one or more additional erase pulses for the first portion of the sector. In this example, query task 510 and task 514 are repeated until erasure of the first portion of the sector has been verified.

As mentioned above, the erase pulse count obtained in task 512 is associated with the preliminary erase operation. In response to the count, adaptive erase bias process 500 determines at least one adjusted erase bias voltage (task 516), which will be utilized during the secondary erase operation. Task 516 may be associated with the adjustment of a drain bias voltage, a gate bias voltage, or both. Briefly, task 516 may increase a baseline drain bias voltage proportionately to the count to obtain an adjusted drain bias voltage and/or decrease a baseline gate bias voltage proportionately to the count to obtain an adjusted gate bias voltage. The determination of the adjusted erase bias voltages is described in more detail below in the context of FIG. 6.

After adaptive bias erase process 500 has dynamically determined the erase bias voltages in this manner, a second portion of the sector can be erased utilizing the adjusted erase bias voltages. In this example, the first portion of the sector and the second portion of the sector are non-intersecting. In other words, none of the bits in the first portion are included in the second portion, and vice versa. Accordingly, process 500 proceeds to erase the remainder of the sector using the adjusted erase bias voltages (task 518). Although not required, process 500 may then save (task 520) the adjusted erase bias voltages (or data indicative of the voltages) for use as respective default erase bias voltages during a subsequent preliminary erase operation for the sector. In other words, the next time the sector is erased, these adjusted erase bias voltages can be applied as the default erase bias voltages during the next iteration of task 506. This updating of the default erase bias voltages may be desirable to optimize the preliminary erase operation. Of course, this approach would utilize memory storage space, which may be undesirable in some practical applications. Accordingly, task 520 is depicted in dashed lines in FIG. 5 to indicate its optional nature.

Figure 6:
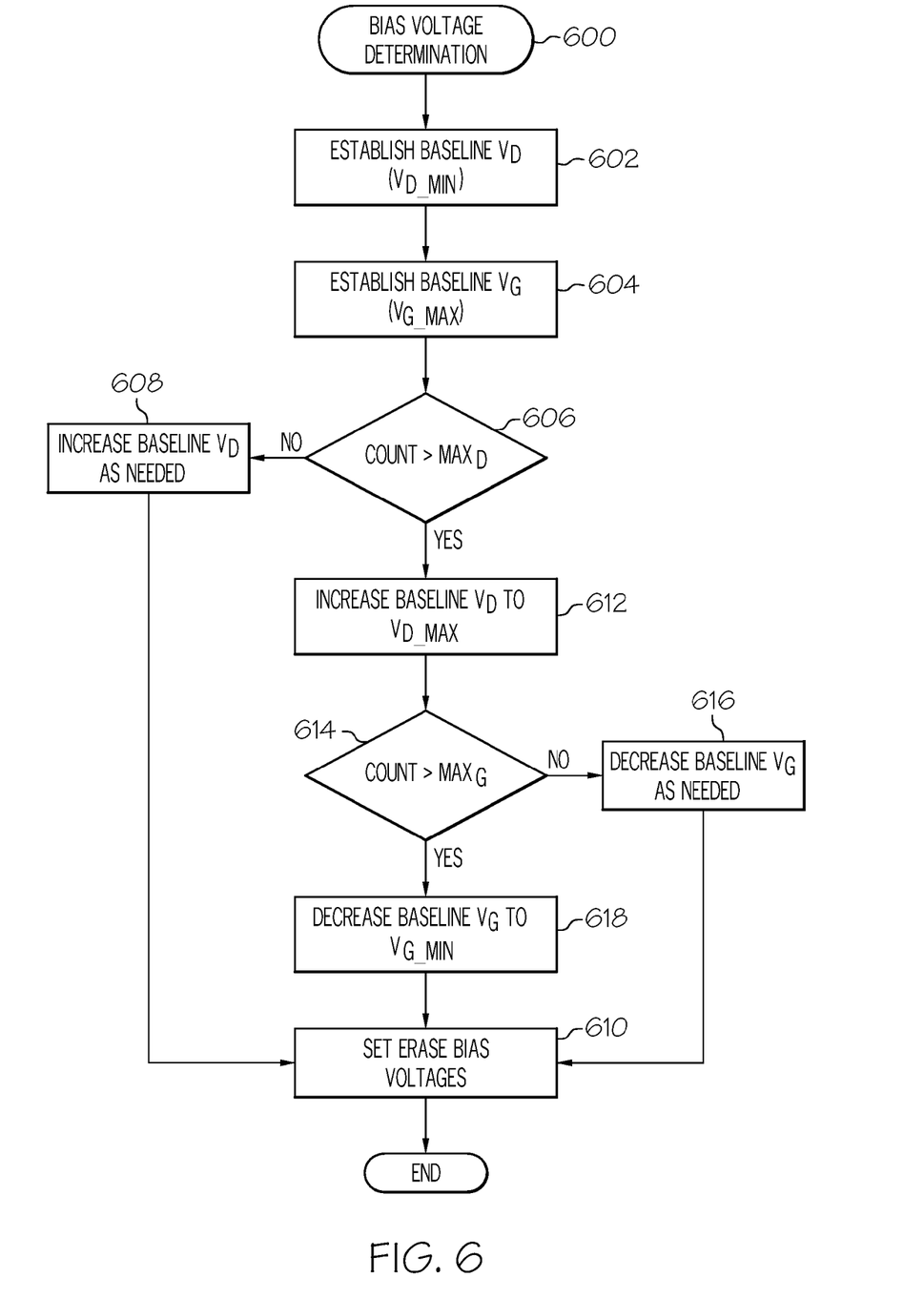
FIG. 6 is a flow chart that illustrates a bias voltage determination process.

FIG. 6 is a flow chart that illustrates a bias voltage determination process 600 suitable for use in connection with an adaptive erase bias operation as described herein. The various tasks performed in connection with process 600 may be performed by software, hardware, firmware, or any combination thereof. For illustrative purposes, the following description of process 600 may refer to elements mentioned above in connection with FIGS. 1-4. In embodiments of the invention, portions of process 600 may be performed by different elements of the described system, e.g., a command component, a voltage generator, or a memory array. It should be appreciated that process 600 may include any number of additional or alternative tasks, the tasks shown in FIG. 6 need not be performed in the illustrated order, and process 600 may be incorporated into a more comprehensive procedure or process having additional functionality not described in detail herein. In this regard, process 600 may be performed in conjunction with adaptive bias erase process 500.

Bias voltage determination process 600 may begin by establishing a baseline drain bias voltage for a group of bits (e.g., a sector) in a flash memory array (task 602). In this example, the baseline drain bias voltage is a minimum drain bias voltage for the sector. In a practical embodiment, this minimum drain bias voltage may be about 4.5 volts, however, this example minimum drain bias voltage is not intended to restrict or limit the application or scope of the embodiments described herein. Process 600 may also establish a baseline gate bias voltage for the sector (task 604). In this example, the baseline gate bias voltage is a maximum gate bias voltage for the sector. In a practical embodiment, this maximum gate drain bias voltage may be about −6.0 volts, however, this example maximum gate bias voltage is not intended to restrict or limit the application or scope of the embodiments described herein. These baseline erase bias voltages serve as reference points for the dynamic adjustment procedure. As mentioned previously, these baseline erase bias voltages may be adjusted according to the erase pulse count obtained during the preliminary erase operation.

In this example, bias voltage determination process 600 favors adjustment of the baseline drain bias voltage over adjustment of the baseline gate bias voltage. Thus, process 600 need not adjust the baseline gate bias voltage if adjustment of the baseline drain bias voltage alone will result in an adequate field between the drain junction and the gate region of the flash memory cell. Accordingly, if the erase pulse count is not greater than a maximum drain bias count (query task 606), then process 600 will increase the baseline drain bias voltage as needed in response to the count (task 608) and set the erase bias voltages (task 610) to be generated for the secondary erase operation, during which the remainder of the sector is erased. Task 608 may increase the baseline drain bias voltage in a manner that is proportional to the count. For this example, the baseline drain bias voltage is about 4.5 volts, and the drain bias voltage can be adjusted to a maximum of about 6.0 volts, in suitable steps (e.g., 100-200 mV steps). Thus, for very low count values the adjusted drain bias voltage may remain close to 4.5 volts, and for high count values the adjusted drain bias voltage may approach 6.0 volts.

The maximum drain bias count represents a point where the drain bias voltage will reach its maximum value (6.0 volts in this example). If the count exceeds this maximum drain bias count (query task 606), then bias voltage determination process 600 may increase the baseline drain bias voltage to the maximum drain bias voltage (task 612) and proceed to adjust the baseline gate bias voltage if needed. If the erase pulse count is not greater than a maximum gate bias count (query task 614), then process 600 will increase the absolute value of the negative gate bias voltage as needed in response to the count (task 616) and set the erase bias voltages (task 610) to be generated for the secondary erase operation, during which the remainder of the sector is erased. Task 616 may adjust the baseline gate bias voltage in a manner that is proportional to the count. For this example, the baseline gate bias voltage is about −6.0 volts, and the gate bias voltage can be adjusted to a minimum of about −10.0, in suitable steps (e.g., 100-500 mV steps). Thus, for lower count values the adjusted gate bias voltage may remain close to −6.0 volts, and for higher count values the adjusted gate bias voltage may approach −10.0 volts. Referring again to query task 614, if the count exceeds the maximum gate bias count, then process 600 may increase the absolute value of the negative gate bias voltage to the minimum gate bias voltage (task 618). For this example, task 618 results in a drain bias voltage of 6.0 volts and a gate bias voltage of −10.0 volts to be generated and utilized for the secondary erase operation.

The adaptive bias erase technique described herein can be employed on a sector-by-sector basis for each erase operation. Consequently, different erase bias voltages may be applied to different sectors in the same flash memory device. This feature is desirable because in practice some sectors are cycled more often than others. Alternatively, the adjusted erase bias voltages may be determined for a beginning sector in the array, and then utilized for all remaining sectors in the array.

The adaptive bias erase scheme may be used in an attempt to optimize the overall erase procedure and to reduce the overall erase time. Moreover, the adaptive bias erase scheme may result in less degradation of the device and less erase time. It should be noted that the adaptive bias erase procedure and the manner in which the system dynamically determines the adjusted bias voltages may vary from that described above, depending upon the implementation of the flash memory system and other practical considerations. Adaptive bias erase process 500 and bias voltage determination process 600 are given as illustrative examples to provide a better understanding of the methodologies described herein.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. An erase method for a nonvolatile memory device having an array of memory cells configured to store information corresponding to at least one bit, the method comprising:
   initiating an erase operation for a group of bits in the array of memory cells, the erase operation comprising a preliminary erase operation for a first portion of the group of bits utilizing a default gate bias voltage;
   obtaining a count corresponding to a number of erase pulses utilized to erase the first portion of the group of bits during the erase operation, wherein obtaining the count is associated with the preliminary erase operation;
   determining an adjusted gate bias voltage in response to the count; and
   erasing a second portion of the group of bits utilizing the adjusted gate bias voltage during the erase operation, wherein determining the adjusted gate bias voltage comprises increasing the absolute value of a baseline negative gate bias voltage proportionately to the count to obtain the adjusted gate bias voltage.

2. An erase method according to claim 1, wherein the first portion of the group of bits and the second portion of the group of bits are non-intersecting.

3. An erase method according to claim 1, wherein the first portion of the group of bits represents less than half of the group of bits.

4. An erase method according to claim 1, wherein:
   the default gate bias voltage is a default drain bias voltage; and
   the adjusted gate bias voltage is an adjusted drain bias voltage.

5. An erase method according to claim 1, further comprising saving the adjusted gate bias voltage for use as a default gate bias voltage during a subsequent preliminary erase operation for the group of bits.

6. An erase method according to claim 1, wherein the group of bits corresponds to a sector in the array.

7. An erase method according to claim 3, wherein the first portion of the group of bits represents approximately ten percent of the group of bits.

8. An erase method according to claim 4, wherein determining the adjusted drain bias voltage comprises increasing a baseline drain bias voltage proportionately to the count to obtain the adjusted drain bias voltage.

9. A nonvolatile memory system comprising:
   an array of memory cells, each memory cell being configured to store information corresponding to at least one bit;
   a command component coupled to the array of memory cells, the command component being configured to initiate an erase operation for a sector of bits in the array of memory cells, wherein the erase operation comprises a preliminary erase operation for the first portion of the group of bits utilizing a default gate bias voltage;
   an erase pulse counter configured to obtain a count corresponding to a number of erase pulses utilized to erase the first portion of the sector during the erase operation, wherein obtaining the count is associated with the preliminary erase operation;
   an erase bias voltage adjustment component configured to determine an adjusted gate bias voltage in response to the count, wherein determining the adjusted gate bias voltage comprises increasing the absolute value of a baseline negative gate bias voltage proportionately to the count to obtain the adjusted gate bias voltage; and
   a voltage generator coupled to the array of memory cells, the voltage generator being configured to apply the adjusted gate bias voltage to the array of memory cells to erase a second portion of the sector during the erase operation.

10. A system according to claim 9, wherein the first portion of the sector and the second portion of the sector are non-intersecting.

11. A system according to claim 9, wherein the first portion of the group of bits represents less than half of the group of bits.

12. A system according to claim 9, wherein:
   the default gate bias voltage is a default drain bias voltage; and
   the adjusted gate bias voltage is an adjusted drain bias voltage.

13. An erase method for a nonvolatile memory device having a sector of memory cells, each memory cell being configured to store information corresponding to at least one bit, the method comprising:
   establishing a baseline drain bias voltage for the sector;
   establishing a baseline negative gate bias voltage for the sector;
   erasing a first portion of bits in the sector utilizing a default drain bias voltage, wherein the first portion of bits is erased during an erase operation;
   obtaining a count corresponding to a number of erase pulses utilized to erase the first portion of bits; and if the count is greater than a maximum drain bias count:
   increasing the absolute value of the baseline negative gate bias voltage in response to the count;
   increasing the baseline drain bias voltage in response to the count;
   generating an adjusted drain bias voltage in response to the increasing step;
   generating an adjusted gate bias voltage in response to the increasing step; and
   erasing a second portion of bits in the sector utilizing the adjusted drain bias voltage and the adjusted gate bias voltage, wherein the second portion of bits is erased during the erase operation.

14. An erase method according to claim 13, wherein the increasing step increases the baseline drain bias voltage proportionately to the count.

15. An erase method according to claim 13, wherein the increasing step increases the absolute value of the baseline negative gate bias voltage proportionately to the count.

16. A system according to claim 11, wherein the first portion of the group of bits represents approximately ten percent of the group of bits.

17. A system according to claim 12, wherein determining the adjusted drain bias voltage comprises increasing a baseline drain bias voltage proportionately to the count to obtain the adjusted drain bias voltage.

* * * * *